(12) United States Patent
Kim et al.

(10) Patent No.: US 10,062,699 B1
(45) Date of Patent: Aug. 28, 2018

(54) CAPACITOR FOR SEMICONDUCTOR MEMORY ELEMENT AND METHOD FOR MANUFACTURING THE SAME

(71) Applicant: KOREA INSTITUTE OF SCIENCE AND TECHNOLOGY, Seoul (KR)

(72) Inventors: Seong Keun Kim, Seoul (KR); Jung Joon Pyeon, Seoul (KR); Cheol Jin Cho, Seoul (KR); Sangtae Kim, Seoul (KR); Doo Seok Jeong, Seoul (KR); Seung-Hyub Baek, Seoul (KR); Chong-Yun Kang, Seoul (KR); Ji-Won Choi, Seoul (KR); Jin-Sang Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 15/648,770

(22) Filed: Jul. 13, 2017

(30) Foreign Application Priority Data

Feb. 28, 2017 (KR) .......................... 10-2017-0026311

(51) Int. Cl.
*H01L 27/108* (2006.01)
*H01L 49/02* (2006.01)
*H01L 21/285* (2006.01)
*H01L 21/02* (2006.01)

(52) U.S. Cl.
CPC .... *H01L 27/10808* (2013.01); *H01L 21/0228* (2013.01); *H01L 21/02186* (2013.01); *H01L 21/28556* (2013.01); *H01L 28/75* (2013.01)

(58) Field of Classification Search
CPC ............. H01L 27/108; H01L 27/10808; H01L 21/02186; H01L 21/0228; H01L 21/28556; H01L 28/75
See application file for complete search history.

(56) References Cited

U.S. PATENT DOCUMENTS

| | | | |
|---|---|---|---|
| 6,475,854 B2 | 11/2002 | Narwankar et al. | |
| 7,459,736 B2 | 12/2008 | Shin et al. | |
| 7,745,233 B2 | 6/2010 | Shin et al. | |
| 8,828,821 B2 * | 9/2014 | Chen ................... | C23C 16/0272 438/238 |
| 2004/0155276 A1 * | 8/2004 | Iwasaki ............. | H01L 21/28185 257/301 |
| 2012/0199944 A1 * | 8/2012 | Huang ..................... | H01G 4/20 257/532 |
| 2012/0202356 A1 * | 8/2012 | Huang .............. | H01L 21/02186 438/785 |

(Continued)

FOREIGN PATENT DOCUMENTS

| | | |
|---|---|---|
| KR | 10-0601959 B1 | 7/2006 |
| KR | 10-0861678 B1 | 10/2008 |

*Primary Examiner* — Fazli Erdem
(74) *Attorney, Agent, or Firm* — Rabin & Berdo, P.C.

(57) ABSTRACT

A capacitor for a semiconductor memory element includes a lower electrode, a dielectric layer disposed on the lower electrode and including titanium oxide, and an upper electrode disposed on the dielectric layer. The lower electrode includes a first metal and a second metal, the first metal including at least one selected from the group consisting of platinum (Pt), osmium (Os), rhodium (Rh) and palladium (Pd), the second metal including at least one selected from the group consisting of ruthenium (Ru) and iridium (Jr).

8 Claims, 10 Drawing Sheets

(56) References Cited

U.S. PATENT DOCUMENTS

| | | | | |
|---|---|---|---|---|
| 2012/0309163 A1* | 12/2012 | Kiyomura | ......... | H01L 27/10817 |
| | | | | 438/396 |
| 2013/0100577 A1* | 4/2013 | Popovici | ................ | H01L 28/40 |
| | | | | 361/305 |
| 2014/0080284 A1* | 3/2014 | Chen | ................ | C23C 16/45525 |
| | | | | 438/396 |
| 2014/0187015 A1* | 7/2014 | Rui | ........................ | H01L 28/56 |
| | | | | 438/381 |
| 2015/0076658 A1* | 3/2015 | Kim | ........................ | H01L 28/65 |
| | | | | 257/532 |

* cited by examiner

CAPACITOR FOR SEMICONDUCTOR MEMORY ELEMENT AND METHOD FOR MANUFACTURING THE SAME

CROSS-REFERENCE TO RELATED APPLICATIONS

This application claims priority under 35 U.S.C. § 119 to Korean Patent Application No. 10-2017-0026311, filed on Feb. 28, 2017, and all the benefits accruing therefrom, the content of which is herein incorporated by reference in its entirety.

BACKGROUND

1. Field

Exemplary embodiments relate to a capacitor. More particularly, exemplary embodiments relate to a capacitor for a semiconductor memory element and a method for manufacturing the capacitor.

2. Description of the Related Art

Recently, with remarkable development of a semiconductor industry, degree of integration of a semiconductor element is rapidly increasing. Especially, research and development are being conducted for a super-fine integrated element, to which a design rule at 20 nm is applied, for a DRAM memory element. A core technology for developing the DRAM memory element to which a design rule at 20 nm is applied, development of a capacitor storing a charge.

A capacitor serving to record information of a binary notation is preferred to have a large capacity and a low leakage current under an operating voltage. In order to achieve the above, research and development are being conducted for a dielectric material having a high permittivity and an electrode material having a low leakage current. Silicon oxide, aluminum oxide, hafnium oxide, zirconium oxide or the like is being used for a conventional dielectric material. Furthermore, polysilicon, TiN or the like is being used for a conventional electrode material. However, due to limitation of a conventional material in itself, a novel dielectric material and a novel electrode material is required for developing a next generation cell.

Titanium oxide ($TiO_2$) having a rutile structure and an aluminum-doped titanium oxide (Al-doped $TiO_2$) are being developed for a dielectric layer for a next generation DRAM capacitor cell. Titanium oxide having a rutile structure has a phase that is stable at a high temperature and is obtained at a high temperature equal or more than 700° C. Thus, it is hardly formed in a normal manufacturing process for a semiconductor. However, it is known that a film of titanium oxide having a rutile structure can be formed on an electrode including a metal film of ruthenium (Ru) or iridium (Ir) or a metal oxide film of ruthenium oxide or iridium oxide. Especially, ruthenium has a relatively high work function, and a process having a superior step-coverage has been developed. Thus, ruthenium with a titanium oxide film is likely to be used for an electrode material for the next generation DRAM capacitor cell.

However, a work function of Ru is about 4.8 eV, which is lower than other precious metals such as Ir (5.1~5.4 eV), Pt (5.1~5.8 eV). Thus, when Ru is used for a capacitor electrode, a capacitor may have a high leakage current.

SUMMARY

Exemplary embodiments provide a capacitor for a semiconductor memory element, which is capable of forming a dielectric layer including titanium oxide of a rutile structure and reducing a leakage current.

Exemplary embodiments provide a method for manufacturing the capacitor for a semiconductor memory element.

According to an exemplary embodiment, a capacitor for a semiconductor memory element includes a lower electrode, a dielectric layer disposed on the lower electrode and including titanium oxide, and an upper electrode disposed on the dielectric layer. The lower electrode includes a first metal and a second metal, the first metal including at least one selected from the group consisting of platinum (Pt), osmium (Os), rhodium (Rh) and palladium (Pd), the second metal including at least one selected from the group consisting of ruthenium (Ru) and iridium (Jr).

In an exemplary embodiment, the titanium oxide of the dielectric layer has a rutile structure.

In an exemplary embodiment, a concentration of the first metal in the lower electrode is 5 at % to 70 at %.

In an exemplary embodiment, a concentration of the first metal in the lower electrode is 40 at % to 60 at %.

In an exemplary embodiment, the upper electrode includes the first metal and the second metal.

According to an exemplary embodiment, a method for manufacturing a capacitor is provided. In the method, a lower electrode is formed. A dielectric layer including titanium oxide is formed on the lower electrode. An upper electrode is formed on the dielectric layer. The lower electrode includes a first metal and a second metal, the first metal including at least one selected from the group consisting of platinum (Pt), osmium (Os), rhodium (Rh) and palladium (Pd), the second metal including at least one selected from the group consisting of ruthenium (Ru) and iridium (Ir).

In an exemplary embodiment, a first sub-cycle and a second sub-cycle are performed to form the lower electrode. In the first sub-cycle, a first precursor including the first metal is provided, the first precursor is purged, a reaction gas is provided, and the reaction gas and a byproduct are purged. In the second sub-cycle, a second precursor including the second metal is provided, the second precursor is purged, a reaction gas is provided, and the reaction gas and a byproduct are purged.

In an exemplary embodiment, the first precursor includes at least one selected from the group consisting of $MeCpPtMe_3$, $CpPtMe_3$, $Pt(acac)_2$, $Pt(hfac)_2$, $Pt(tmhd)_2$, $(COD)Pt(CH_3)_3$, $Pd(hfac)_2$, $Pd(tmhd)_2$ and $Os_3(CO)_{12}$.

In an exemplary embodiment, the second precursor includes at least one selected from the group consisting of $Ru(Cp)_2$, $Ru(MeCp)_2$, $Ru(EtCp)_2$, $Ru(tmhd)_3$, $Ru(mhd)_3$, $RuO_4$, $RuCl$, $RuCl_3$, 2,4-(dimethylpentadienyl)(ethylcyclopentadienyl)Ru, ethylbenzene(1-ethyl-1,4cyclohexadiene)Ruthenium, bis(methylallyl)(1,5-cyclooctadiene)Ru, (MeCp)Ir(CHD), $Ir(acac)_3$, Ir(COD)(Cp), Ir(EtCp)(COD) and (1,5-hexadiene)(1-isopropyl-4-methylbenzene)Ru.

In an exemplary embodiment, the reaction gas includes at least one oxidizing agent selected from the group consisting of oxygen, oxygen plasma, ozone, nitrogen oxide and nitrous oxide, or includes at least one reducing agent selected from the group consisting of hydrogen, hydrogen plasma, ammonia and ammonia plasma.

In an exemplary embodiment, the dielectric layer including titanium oxide is formed through atomic layer deposition at a deposition temperature equal to or less than 400° C.

According to the exemplary embodiments, titanium oxide having a rutile structure may be formed at a relatively low temperature. Thus, deterioration of a memory element may be prevented, a dielectric layer having a high permittivity may be obtained. Furthermore, a leakage current may be reduced by increased work function. Furthermore, because the capacitor electrode does not include oxide, the capacitor electrode may not be damaged by a heat-treating process.

BRIEF DESCRIPTION OF THE DRAWINGS

The above and other features and advantages will become more apparent by describing exemplary embodiments thereof with reference to the accompanying drawings, in which.

DETAILED DESCRIPTION

Example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity. It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 6 are cross-sectional views illustrating a method for manufacturing a capacitor according to an exemplary embodiment. FIG. 7 is a timing chart illustrating a process of forming an electrode layer in the method for manufacturing a capacitor according to an exemplary embodiment. For example, the following method may be used for manufacturing a capacitor of a DRAM.

Figure 1:
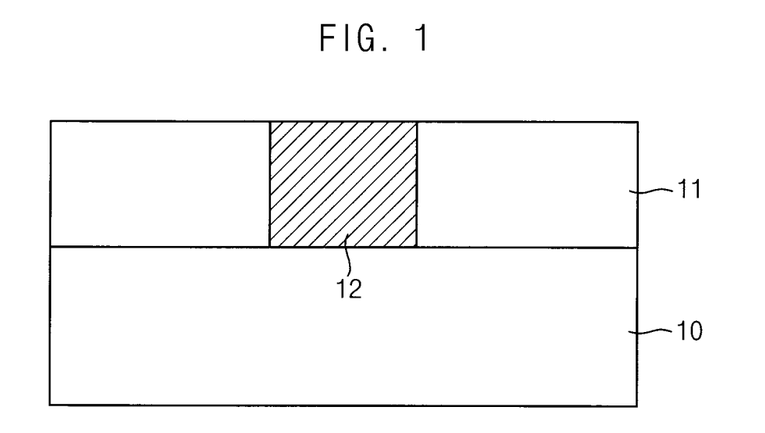
FIGS. 1 to 6 are cross-sectional views illustrating a method for manufacturing a capacitor according to an exemplary embodiment.

Referring to FIG. 1, an interlayer insulation layer 11 and a contact plug 12 passing through the interlayer insulation layer 11 are formed on a substrate 10.

For example, the interlayer insulation layer 11 is deposited on the substrate 10, and etched to form a contact hole exposing a portion of the substrate 10. Thereafter, a conductive layer is formed to fill the contact hole and partially removed through etch-back or chemical mechanical polishing to form the contact plug 12 filling and disposed in the contact hole.

For example, the interlayer insulation layer 11 may include silicon oxide. Particularly, the interlayer insulation layer 11 may include a single layer of an HDP (High Density Plasma) oxide layer, a BPSG (Boron Phosphorus Silicate Glass) layer, a PSG (Phosphorus Silicate Glass) layer, a PETEOS (Plasma Enhanced Tetra EthylOrtho Silicate) layer, a PECVD (Plasma Enhanced Chemical Vapor Deposition) layer, a USG (Un-doped Silicate Glass) layer, an FSG (Fluorinated Silicate Glass) layer, a CDO (Carbon Doped Oxide) layer or an OSG (Organic Silicate Glass) layer, or a stacked structure thereof.

The conductive layer forming the contact plug 12 may include tungsten, copper, titanium, tantalum, nitride thereof, silicide thereof, doped polysilicon or the like. For example, the contact plug 12 may have a stacked structure of poly-silicon/TiSix(x is 1 to 10)/TiN, a stacked structure of W/TiN, a single layer of TiN or the like.

Figure 2:
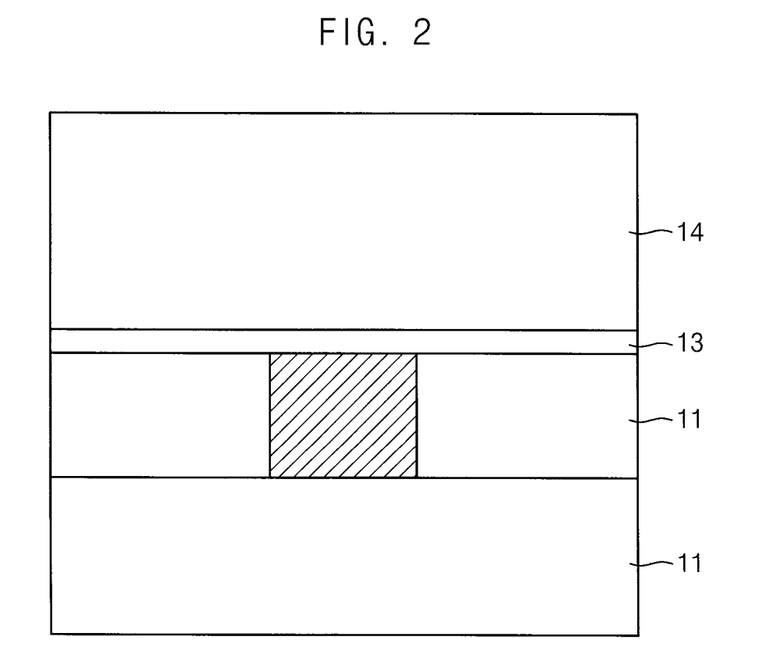

Referring to FIG. 2, an etch-stop layer 13 and a sacrifice insulation layer 14 are formed on the interlayer insulation layer and the contact plug 12.

The etch-stop layer 13 and the sacrifice insulation layer 14 may include different materials. For example, the etch-stop layer 13 may include nitride such as silicon nitride, and the sacrifice insulation layer 14 may include oxide such as silicon oxide.

Figure 3:
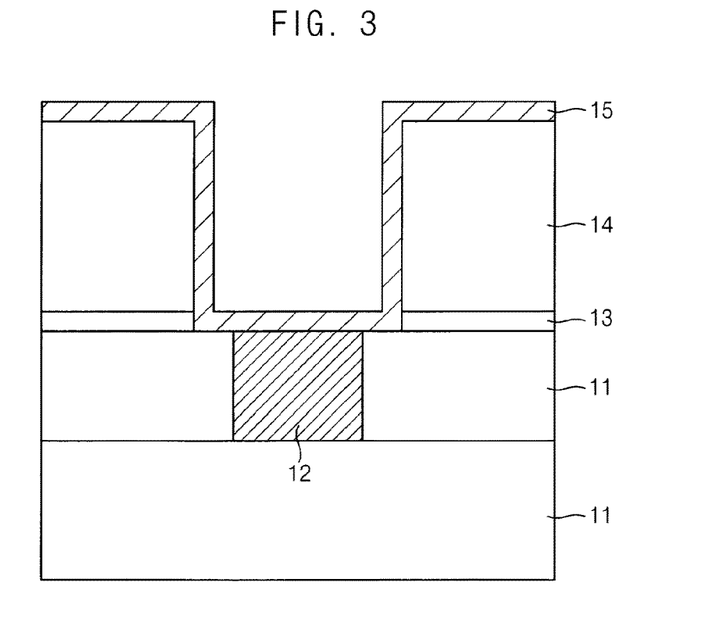

Referring to FIG. 3, the etch-stop layer 13 and the sacrifice insulation layer 14 are etched through an etching process such as a photolithography to form a hole exposing the contact plug 12. Thereafter, a lower electrode layer 15 is formed to cover the contact plug 12 and the sacrifice insulation layer 14.

The lower electrode layer 15 includes at least a first metal and a second metal. The first metal and the second metal are platinum group metals that different from each other. The first metal has a work function higher than the second metal. For example, the first metal may include platinum (Pt), osmium (Os), rhodium (Rh), palladium (Pd) or the like. The second metal has a work function lower than the first metal, and its oxide has a rutile structure. For example, the second metal includes ruthenium (Ru), iridium (Ir) or the like. Thus, the lower electrode layer 15 may include an alloy of the first metal and the second metal.

In order to form the lower electrode layer 15 including the first and second metals, atomic layer deposition (ALD), plasma-enhanced atomic layer deposition (PEALD), chemical vapor deposition (CVD) or the like may be performed. In an exemplary embodiment, atomic layer deposition may be used for forming the lower electrode layer 15.

In the process of the atomic layer deposition, a first precursor including the first metal, a second precursor including the second metal and a reaction gas may be provided. After the first precursor, the second precursor and the reaction gas are respectively provided, a purge gas may be provided for purging.

For example, referring to FIG. 7, a process of providing the first precursor, a process of providing the reaction gas and a process of providing the purge gas may be performed in a first sub-cycle, and a process of providing the second precursor, a process of providing the reaction gas and a process of providing the purge gas may be performed in a second sub-cycle. m times of the first sub-cycle and n times of the second sub-cycle may be performed in a super-cycle, wherein m and n are respectively natural numbers. The super-cycle is repeated to form the lower electrode layer 15 having a desired thickness.

For example, a first precursor injected into an atomic layer deposition chamber adsorbs to a deposition object. Thereafter, a purge gas is provided into the atomic layer deposition chamber to purge non-adsorbing first precursor. A reaction gas may react with the first precursor to form an atomic layer of the first metal. A purge gas is provided into the atomic layer deposition chamber to purge reaction byproduct and remaining reaction gas. An atomic layer of the second metal may be formed through processes similar to the above.

For example, the first precursor may include $MeCpPtMe_3$, $CpPtMe_3$, $Pt(acac)_2$, $Pt(hfac)_2$, $Pt(tmhd)_2$, $(COD)Pt(CH_3)_2$, $Pd(hfac)_2$, $Pd(tmhd)_2$, $Os_3(CO)_{12}$ or the like. These may be used each alone or in a combination thereof.

For example, the second precursor may include $Ru(Cp)_2$, $Ru(MeCp)_2$, $Ru(EtCp)_2$, $Ru(tmhd)_3$, $Ru(mhd)_3$, $RuO_4$, RuCl, $RuCl_3$, 2,4-(dimethylpentadienyl)(ethylcyclopentadienyl)Ru, ethylbenzene(1-ethyl-1,4cyclohexadiene)Ruthenium, bis(methylallyl)(1,5-cyclooctadiene)Ru, (MeCp)Ir (CHD), $Ir(acac)_3$, Ir(COD)(Cp), Ir(EtCp)(COD), (1,5-hexadiene)(1-isopropyl-4-methylbenzene)Ru or the like. These may be used each alone or in a combination thereof.

For example, the reaction gas may include an oxidizing agent such as oxygen, oxygen plasma, ozone, nitrogen oxide, nitrous oxide or the like, and a reducing agent such as hydrogen, hydrogen plasma, ammonia, ammonia plasma or the like. These may be used each alone or in a combination thereof.

For example, the purge gas may include an inert gas such as nitrogen gas.

In an exemplary embodiment, an inert gas such as argon gas may be used for a transporting gas to provide the first precursor and the second precursor.

For example, an atomic ratio of the first metal in the lower electrode layer 15 may be 5 at % to 70 at %, and may be preferably 40 at % to 60 at %. When an amount of the first metal is excessively small, a work function of the lower electrode layer 15 may be reduced thereby increasing a leakage current. When an amount of the first metal is excessively large, titanium oxide formed on the lower electrode layer 15 may have an anatase structure thereby decreasing permittivity.

Figure 4:
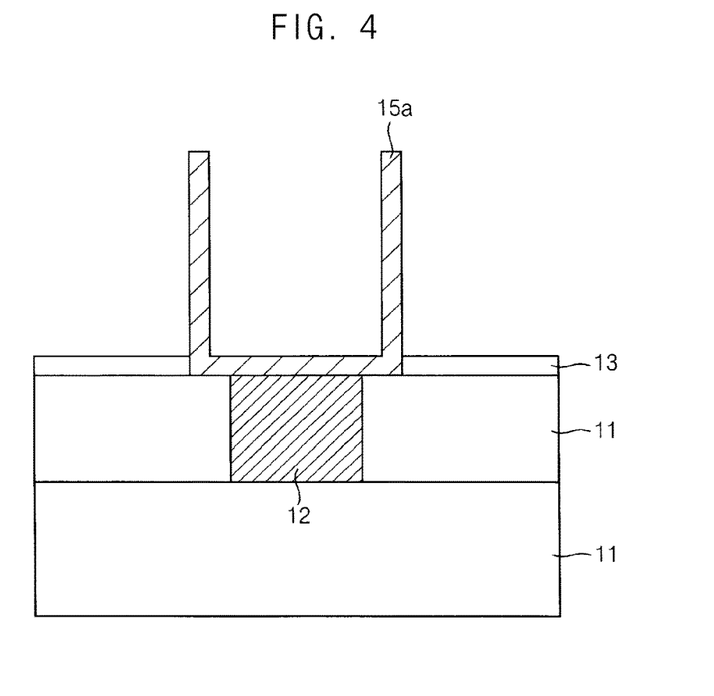

Referring to FIG. 4, the lower electrode layer 15 formed on the sacrifice insulation layer 14 is removed through etch-back or chemical mechanical polishing. Thus, the sacrifice insulation layer 14 is exposed, and a lower electrode 15a is formed. The lower electrode 15a may include a bottom portion extending in a horizontal direction, and a sidewall extending from the bottom portion in a vertical direction. For example, the lower electrode 15a may have a cylindrical shape.

Thereafter, the sacrifice insulation layer 14 is removed. For example, an etching solution having etching selectivity to a material of the sacrifice insulation layer 14, for example, an oxide, may be provided to the sacrifice insulation layer 14. Since the etching solution has etching selectivity to the sacrifice insulation layer 14, the etch-stop layer 13 is not etched and may remain.

Figure 5:
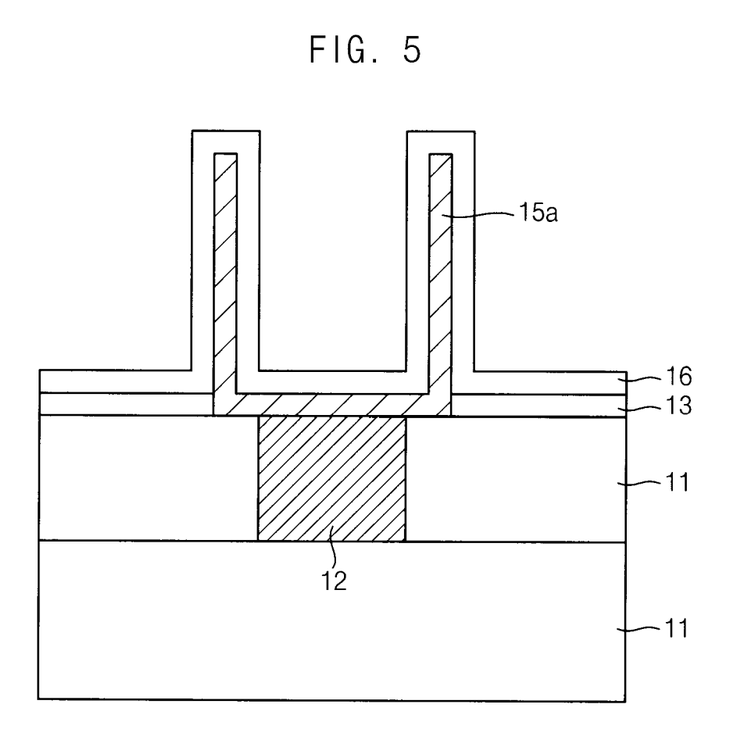

Referring to FIG. 5, a dielectric layer 16 is formed to cover the lower electrode 15a. The dielectric layer 16 includes titanium oxide. The dielectric layer 16 may cover a surface of the lower electrode 15a and an upper surface of the etch-stop layer 13. The titanium oxide may include a high-permittivity dielectric material such as titanium dioxide ($TiO_2$), aluminum-doped titanium dioxide, strontium titanium oxide ($SrTiO_3$) or the like.

Preferably, the titanium oxide of the dielectric layer 16 has a rutile structure. Since the lower electrode 15a include the second metal such as Ru, Jr or the like, the titanium oxide of the dielectric layer 16 formed on the lower electrode 15a may have a rutile structure and may have a high permittivity. Furthermore, the titanium oxide dielectric layer 16 having a rutile structure may be formed at a relatively low temperature, for example, equal to or less than 400° C. Thus, deterioration of a memory element may be prevented, and manufacturing efficiency may be improved.

The dielectric layer 16 may be formed through atomic layer deposition, plasma-enhanced atomic layer deposition, chemical vapor deposition or the like. In an exemplary embodiment, atomic layer deposition may be used for forming the dielectric layer 16.

For example, in order to perform the atomic layer deposition, a step of providing a titanium precursor, a step of providing a reaction gas and a step of providing a purge gas may be performed in a sub-cycle. The sub-cycle may be repeated to form the dielectric layer 16 having a desired thickness.

For example, the titanium precursor may include $Ti(NEtMe)_4$, $Ti[OCH(CH_3)_2]_4$, $TiX_4$(X represents halogen atom) or the like. The reaction gas may include ozone, oxygen, oxygen plasma, hydrogen peroxide or the like.

Preferably, the dielectric layer 16 may be in direct contact with the lower electrode 15a.

Figure 6:
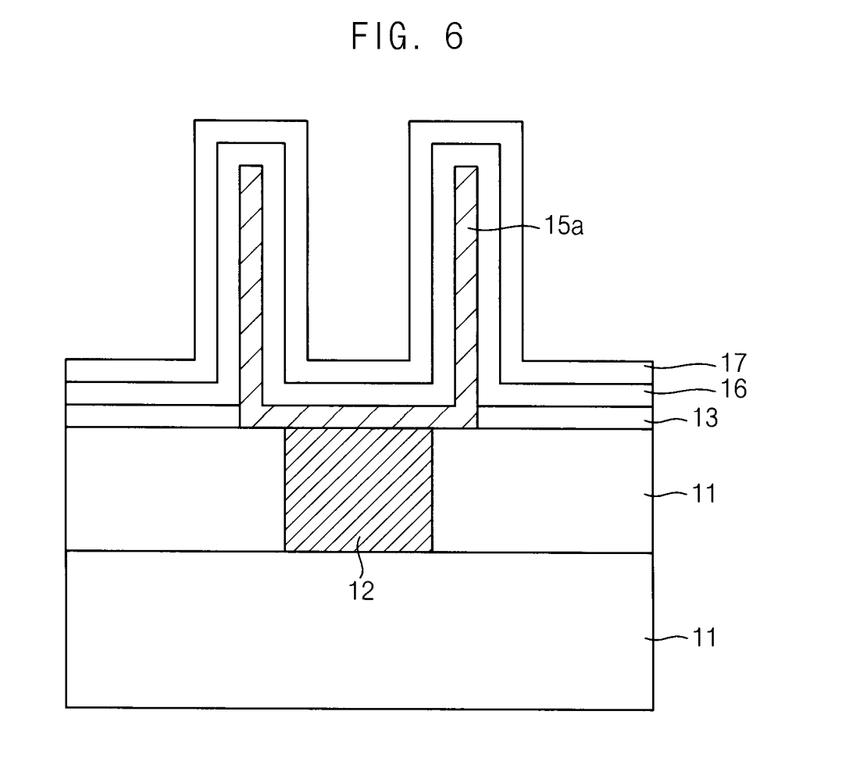
Figure 7:
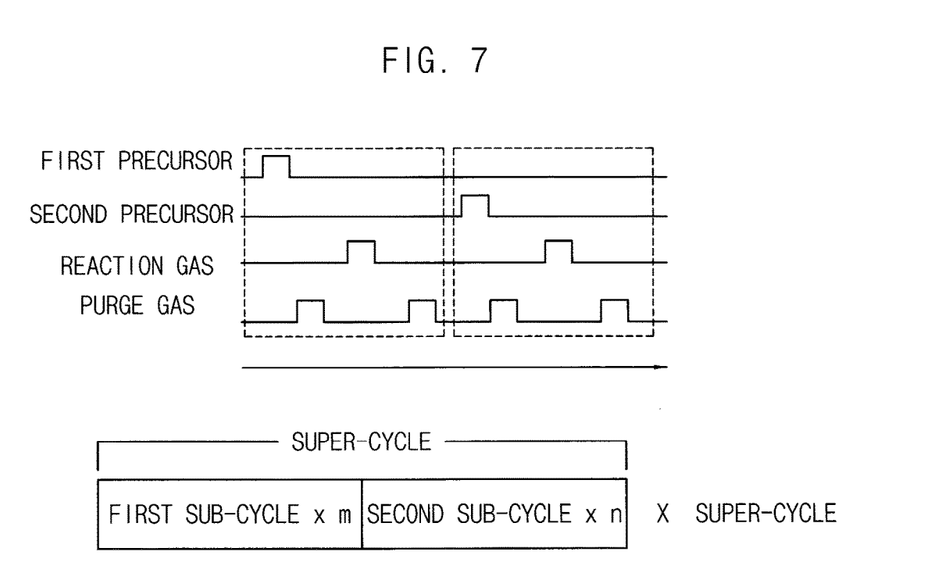
FIG. 7 is a timing chart illustrating a process of forming an electrode layer in the method for manufacturing a capacitor according to an exemplary embodiment.

Referring to FIG. 6, an upper electrode 17 is formed on the dielectric layer 16. The upper electrode 17 may include a first metal and a second metal like the lower electrode 15a. The first metal has a work function higher than the second metal. For example, the first metal may include platinum (Pt), osmium (Os), rhodium (Rh), palladium (Pd) or the like. The second metal has a work function lower than the first metal, and its oxide has a rutile structure. For example, the second metal includes ruthenium (Ru), iridium (Jr) or the like. The upper electrode 17 may be formed through atomic layer deposition or the like.

In another exemplary embodiment, the upper electrode 17 may include different composition from the lower electrode 15a. For example, the upper electrode 17 may include only one of the first and second metals, or may include tantalum nitride, tungsten, tungsten nitride, titanium nitride, doped polysilicon. The upper electrode 17 may have a mono-layered structure or a multiple-layered structure.

In another exemplary embodiment, while the upper electrode 17 includes both of the first and second metals, the lower electrode 15a may include only one of the first and second metals, or may include tantalum nitride, tungsten, tungsten nitride, titanium nitride, doped polysilicon.

According to exemplary embodiments of the present invention, a titanium oxide dielectric layer is formed on a capacitor electrode including a first metal, which has a higher work function and includes platinum (Pt), osmium (Os), rhodium (Rh), palladium (Pd) or the like, and a second metal, which has a work function lower than the first metal and includes ruthenium (Ru), iridium (Jr) or the like, of which oxide has a rutile structure. Thus, titanium oxide having a rutile structure may be formed at a relatively low temperature. Thus, deterioration of a memory element may be prevented, a dielectric layer having a high permittivity may be obtained. Furthermore, a leakage current may be reduced by increased work function. Furthermore, because the capacitor electrode does not include oxide, the capacitor electrode may not be damaged by a heat-treating process.

Hereinafter, a capacitor and a method for manufacturing the capacitor according to the present invention will be explained with reference to particular examples.

EXAMPLE

A platinum-ruthenium film was formed by atomic layer deposition repeating cycles explained with reference to FIG. 7 by 350 times at a deposition temperature of about 300° C. MeCpPtMe$_3$ was used for a platinum precursor, (1,5-hexadiene)(1-isopropyl-4-methylbenzene)Ru was used for a ruthenium precursor, oxygen gas was used for a reaction gas and nitrogen gas was used for a purge gas. In the above, the number of sub-cycles was adjusted for varying an amount of platinum to be 0 at %, 9 at %, 12 at %, 18 at %, 21 at %, 31 at %, 43 at % and 100 at %. As a result, films having a thickness of about 10 nm to about 15 nm were formed.

A titanium oxide dielectric layer having a thickness of about 30 nm was formed on the films through atomic layer deposition using ozone for a reaction gas at a deposition temperature of 260° C. Thereafter, an upper electrode having a thickness of about 40 nm was formed on the titanium oxide dielectric layer.

Figure 8:
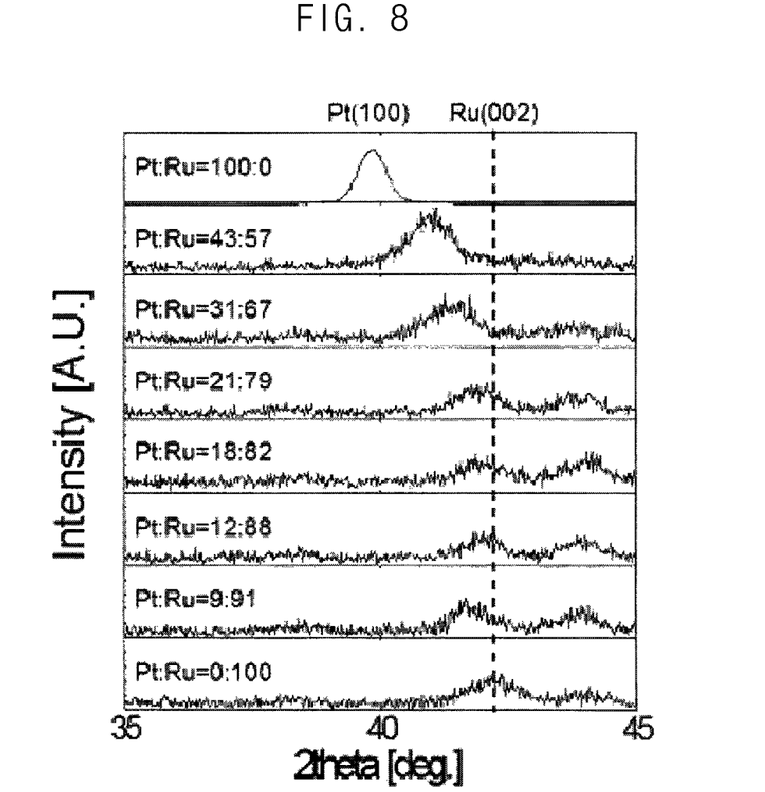
FIG. 8 is an X-ray diffraction pattern of a platinum-ruthenium film formed according to an example of the present invention.
Figure 9:
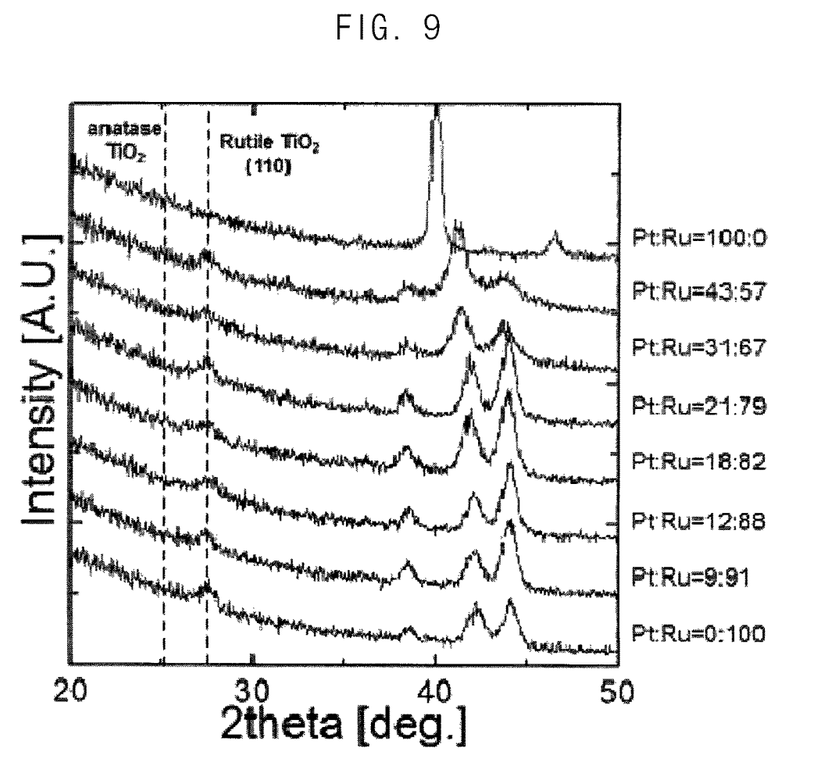
FIG. 9 is an X-ray diffraction pattern of a titanium oxide dielectric layer formed on the platinum-ruthenium film according to an example of the present invention.
Figure 10:
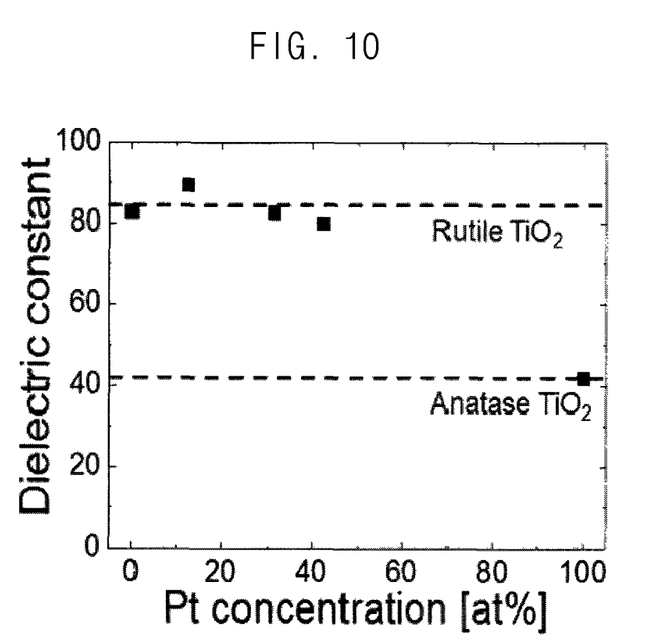
FIG. 10 is a graph showing a permittivity of the titanium oxide dielectric layer formed on the platinum-ruthenium film according to an example of the present invention.
Figure 11:
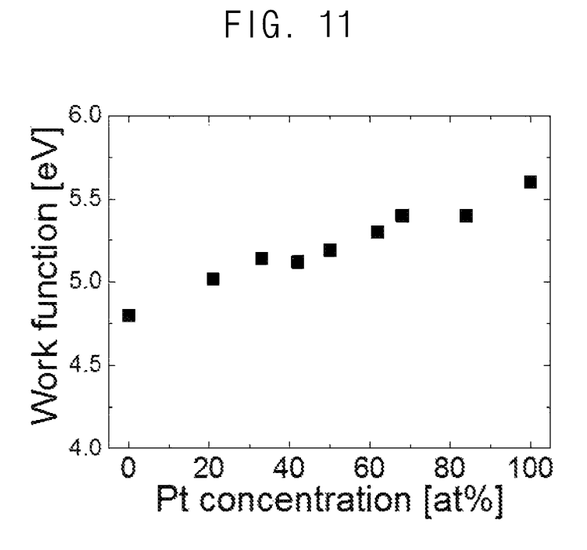
FIG. 11 is a graph showing a work function of the platinum-ruthenium film according to an example of the present invention depending on platinum concentration, which was measured by UV ray electron spectroscopy.
Figure 12:
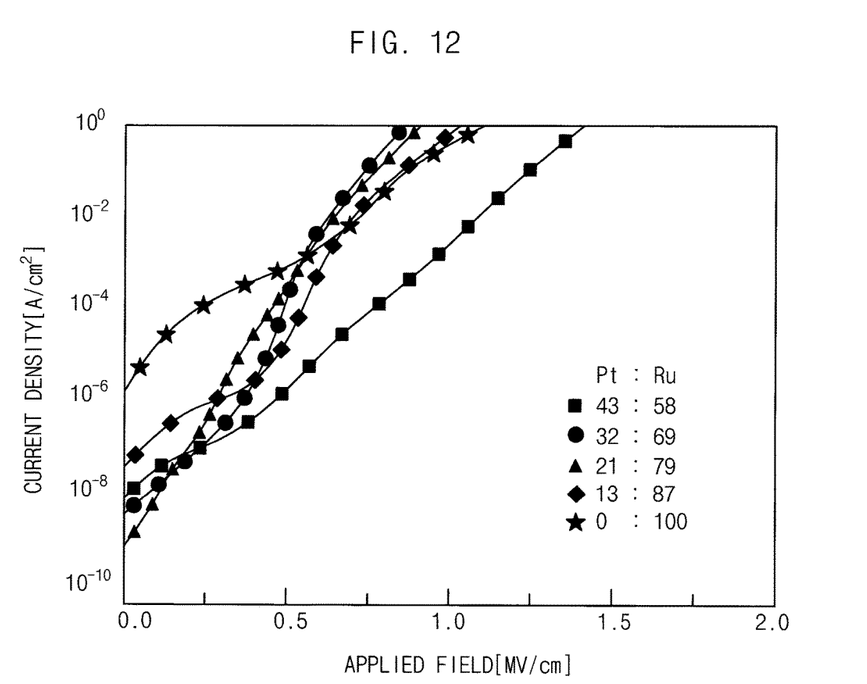
FIG. 12 is a graph showing leakage current of the titanium oxide dielectric layer formed on the platinum-ruthenium film according to an example of the present invention.

FIG. 8 is an X-ray diffraction pattern of a platinum-ruthenium film formed according to an example of the present invention. FIG. 9 is an X-ray diffraction pattern of a titanium oxide dielectric layer formed on the platinum-ruthenium film according to an example of the present invention. FIG. 10 is a graph showing a permittivity of the titanium oxide dielectric layer formed on the platinum-ruthenium film according to an example of the present invention. FIG. 11 is a graph showing a work function of the platinum-ruthenium film according to an example of the present invention depending on platinum concentration, which was measured by UV ray electron spectroscopy. FIG. 12 is a graph showing leakage current of the titanium oxide dielectric layer formed on the platinum-ruthenium film according to an example of the present invention.

Referring to FIG. 8, it can be noted that composition of a platinum-ruthenium film formed through atomic layer deposition can be changed by adjusting the number of cycles providing a platinum precursor and a ruthenium precursor. Particularly, as concentration of platinum increases, a peak showing ruthenium moves in a left direction, which shows that ruthenium and platinum are well mixed and combined with chemical bonds.

Referring to FIGS. 9 and 10, an anatase crystal peak is not observed, but a rutile crystal peak is observed in platinum concentration range of 9 at % to 43 at %. Furthermore, a high dielectric constant (about 80) is maintained in platinum concentration range of 0 at % to 43 at %. Thus, it can be noted that a titanium oxide dielectric layer having a rutile structure can be formed according to examples of the present invention Referring to FIGS. 11 and 12, a work function increases and a leakage current decreases as platinum concentration increases. Especially, a leakage current remarkably decreases when platinum concentration is more than 40 at %.

Exemplary embodiments of the present invention may be used for manufacturing various elements including a capacitor electrode such as a semiconductor memory element.

The foregoing is illustrative and is not to be construed as limiting thereof. Although a few exemplary embodiments have been described, those skilled in the art will readily appreciate that many modifications are possible in the exemplary embodiments without materially departing from the novel teachings, aspects, and advantages of the invention. Accordingly, all such modifications are intended to be included within the scope of this disclosure.

What is claimed is:

1. A capacitor for a semiconductor memory element, the capacitor comprising:
   a lower electrode;
   a dielectric layer disposed on the lower electrode and including titanium oxide having a rutile structure; and
   an upper electrode disposed on the dielectric layer,
   wherein the lower electrode includes an alloy of a first metal and a second metal, the first metal including at least one selected from the group consisting of platinum (Pt), osmium (Os), rhodium (Rh) and palladium (Pd), the second metal including at least one selected from the group consisting of ruthenium (Ru) and iridium (Ir), and
   wherein a concentration of the first metal in the alloy is 40 at % to 60 at %.

2. The capacitor of claim 1, wherein the upper electrode includes the alloy of the first metal and the second metal.

3. A method for manufacturing a capacitor, the method comprising:
   forming a lower electrode;
   forming a dielectric layer including titanium oxide having a rutile structure on the lower electrode; and
   forming an upper electrode on the dielectric layer,
   wherein the lower electrode includes an alloy of a first metal and a second metal, the first metal including at least one selected from the group consisting of platinum (Pt), osmium (Os), rhodium (Rh) and palladium (Pd), the second metal including at least one selected from the group consisting of ruthenium (Ru) and iridium (Ir), and wherein a concentration of the first metal in the alloy is 40 at % to 60 at %.

4. The method of claim 3, wherein forming the lower electrode includes a first sub-cycle and a second sub-cycle, wherein the first sub-cycle includes:
providing a first precursor including the first metal;
purging the first precursor;
providing a reaction gas; and
purging the reaction gas and a byproduct, wherein the second sub-cycle includes:
providing a second precursor including the second metal;
purging the second precursor;
providing a reaction gas; and
purging the reaction gas and a byproduct.

5. The method of claim 4, wherein the first precursor includes at least one selected from the group consisting of $MeCpPtMe_3$, $CpPtMe_3$, $Pt(acac)_2$, $Pt(hfac)_2$, $Pt(tmhd)_2$, $(COD)Pt(CH_3)_3$, $Pd(hfac)_2$, $Pd(tmhd)_2$ and $Os_3(CO)_{12}$.

6. The method of claim 4, wherein the second precursor includes at least one selected from the group consisting of $Ru(Cp)_2$, $Ru(MeCp)_2$, $Ru(EtCp)_2$, $Ru(tmhd)_3$, $Ru(mhd)_3$, $RuO_4$, $RuCl$, $RuCl_3$, 2,4-(dimethylpentadienyl)(ethylcyclopentadienyl)Ru, ethylbenzene(1-ethyl-1,4cyclohexadiene)Ruthenium, bis(methylallyl)(1,5-cyclooctadiene)Ru, $(MeCp)Ir(CHD)$, $Ir(acac)_3$, $Ir(COD)(Cp)$, $Ir(EtCp)(COD)$ and (1,5-hexadiene)(1-isopropyl-4-methylbenzene)Ru.

7. The method of claim 4, wherein the reaction gas includes at least one oxidizing agent selected from the group consisting of oxygen, oxygen plasma, ozone, nitrogen oxide and nitrous oxide, or includes at least one reducing agent selected from the group consisting of hydrogen, hydrogen plasma, ammonia and ammonia plasma.

8. The method of claim 3, wherein the dielectric layer including titanium oxide is formed through atomic layer deposition at a deposition temperature equal to or less than 400° C.

* * * * *